(12) United States Patent
Loh

(10) Patent No.: US 8,308,331 B2
(45) Date of Patent: *Nov. 13, 2012

(54) LED BACKLIGHTING FOR DISPLAYS

(75) Inventor: Ban P. Loh, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/175,600

(22) Filed: Jul. 1, 2011

(65) Prior Publication Data

US 2011/0261554 A1 Oct. 27, 2011

Related U.S. Application Data

(63) Continuation of application No. 11/153,724, filed on Jun. 14, 2005, now Pat. No. 7,980,743.

(51) Int. Cl.
*F21V 7/04* (2006.01)

(52) U.S. Cl. .. 362/561; 362/97.1; 362/97.3; 362/249.02

(58) Field of Classification Search .................. 362/29, 362/30, 33, 97.1, 97.2, 97.3, 125, 227, 240, 362/241, 242, 245, 249.02, 373, 394, 555, 362/558, 559, 560, 561, 800, 812; 40/452, 40/541, 542, 544, 564, 565, 581; 359/613, 359/819; 257/98–100, 774
See application file for complete search history.

(56) References Cited

U.S. PATENT DOCUMENTS 3,443,140 A 5/1969 Jensen
3,760,237 A 9/1973 Jaffe 3,875,456 A 4/1975 Kano et al.
4,152,618 A 5/1979 Abe et al.
4,168,102 A * 9/1979 Chida et al. ................... 313/111
(Continued)

FOREIGN PATENT DOCUMENTS

CN 03820849 8/2008
(Continued)

OTHER PUBLICATIONS

Non-Final Office Action for U.S. Appl. No. 13/022,365 dated Jul. 14, 2011.

(Continued)

*Primary Examiner* — Hargobind S Sawhney
(74) *Attorney, Agent, or Firm* — Jenkins, Wilson, Taylor & Hunt, P.A.

(57) ABSTRACT

A display system including a display panel having a first major surface and a second major surface and a lighting system adapted to provide uniform luminance proximal to the display panel is disclosed. The lighting system includes an illuminating substrate having a first major surface with reflective coating and a second major surface. The illuminating substrate defines an array of mounting holes, each hole occupied by an LED module. An array of light emitting diode (LED) modules are affixed to the illuminating substrate, each module including at least one light emitting diode adapted to emit light. The lighting system can also include a diffusant layer which can be optically coupled to the illuminating substrate by soft optical gel and is placed close to or made to contact the display panel. The optical gel may contain phosphors or other optical substance for added optical performance to the lighting system. The diffusant layer has beveled edges at critical angle of refraction or coated with reflective material to minimize light loss at its edges. Each of the LED modules includes at least one LED chip, conductive traces connected to the LED chip and a heat sink.

29 Claims, 4 Drawing Sheets

U.S. PATENT DOCUMENTS

| | | | |
|---|---|---|---|
| 4,267,559 A | 5/1981 | Johnson et al. | |
| 4,603,496 A | 8/1986 | Latz et al. | |
| 5,119,174 A * | 6/1992 | Chen | 257/98 |
| 5,173,839 A | 12/1992 | Metz, Jr. | |
| 5,433,295 A * | 7/1995 | Murphy | 187/397 |
| 5,633,963 A | 5/1997 | Rickenbach et al. | |
| 5,649,757 A | 7/1997 | Aleman | |
| 5,785,418 A | 7/1998 | Hochstein | |
| 5,789,772 A | 8/1998 | Jiang | |
| 5,835,661 A | 11/1998 | Tai | |
| 5,841,177 A | 11/1998 | Komoto et al. | |
| 5,847,507 A | 12/1998 | Butterworth | |
| 5,849,396 A | 12/1998 | Ali et al. | |
| 5,851,847 A | 12/1998 | Yamanaka | |
| 5,857,767 A | 1/1999 | Hochstein | |
| 5,869,883 A | 2/1999 | Mehringer et al. | |
| 5,903,052 A | 5/1999 | Chen et al. | |
| 5,907,151 A | 5/1999 | Gramann et al. | |
| 5,959,316 A | 9/1999 | Lowery | |
| 5,982,090 A | 11/1999 | Kalmanash et al. | |
| 5,998,925 A | 12/1999 | Shimizu et al. | |
| 6,060,729 A | 5/2000 | Suzuki et al. | |
| 6,124,635 A | 9/2000 | Kuwabara | |
| 6,155,699 A | 12/2000 | Miller et al. | |
| 6,159,033 A | 12/2000 | Oka | |
| 6,180,962 B1 | 1/2001 | Ishinaga | |
| 6,238,599 B1 | 5/2001 | Gelorme et al. | |
| 6,274,924 B1 | 8/2001 | Carey et al. | |
| 6,281,435 B1 | 8/2001 | Maekawa | |
| 6,307,272 B1 | 10/2001 | Takahashi et al. | |
| 6,318,886 B1 | 11/2001 | Stopa et al. | |
| 6,329,706 B1 | 12/2001 | Nam | |
| 6,331,063 B1 | 12/2001 | Kamada et al. | |
| 6,335,548 B1 | 1/2002 | Roberts et al. | |
| 6,362,964 B1 | 3/2002 | Dubhashi et al. | |
| RE37,707 E | 5/2002 | Bozzini et al. | |
| 6,429,513 B1 | 8/2002 | Shermer, IV et al. | |
| 6,444,498 B1 | 9/2002 | Huang et al. | |
| 6,456,766 B1 | 9/2002 | Shaw et al. | |
| 6,457,645 B1 | 10/2002 | Gardner, Jr. | |
| 6,468,821 B2 | 10/2002 | Maeda et al. | |
| 6,469,322 B1 | 10/2002 | Srivasta et al. | |
| D465,207 S | 11/2002 | Williams et al. | |
| 6,480,389 B1 | 11/2002 | Shie et al. | |
| 6,489,637 B1 | 12/2002 | Sakamoto et al. | |
| 6,490,104 B1 * | 12/2002 | Gleckman et al. | 359/819 |
| 6,492,725 B1 | 12/2002 | Loh et al. | |
| 6,501,103 B1 | 12/2002 | Jory et al. | |
| 6,525,386 B1 | 2/2003 | Mills | |
| 6,531,328 B1 | 3/2003 | Chen | |
| 6,541,800 B2 | 4/2003 | Barnett et al. | |
| 6,559,525 B2 | 5/2003 | Huang | |
| 6,582,103 B1 | 6/2003 | Popovich et al. | |
| 6,610,563 B1 | 8/2003 | Waitl et al. | |
| 6,614,103 B1 | 9/2003 | Durocher et al. | |
| 6,670,648 B2 | 12/2003 | Isokawa et al. | |
| 6,672,734 B2 | 1/2004 | Lammers | |
| 6,680,491 B2 | 1/2004 | Nakanishi et al. | |
| 6,680,568 B2 | 1/2004 | Fujiwara et al. | |
| 6,707,069 B2 | 3/2004 | Song et al. | |
| 6,710,544 B2 | 3/2004 | Schliep | |
| 6,759,803 B2 | 7/2004 | Sorg | |
| 6,768,525 B2 | 7/2004 | Paolini et al. | |
| 6,789,921 B1 * | 9/2004 | Deloy et al. | 362/97.3 |
| 6,791,259 B1 | 9/2004 | Stokes et al. | |
| 6,809,347 B2 | 10/2004 | Tasch et al. | |
| 6,844,903 B2 | 1/2005 | Mueller-Mach et al. | |
| 6,849,867 B2 | 2/2005 | Roberts et al. | |
| 6,850,001 B2 | 2/2005 | Takekuma | |
| 6,864,567 B2 | 3/2005 | Yu | |
| 6,874,910 B2 | 4/2005 | Sugimoto et al. | |
| 6,897,486 B2 | 5/2005 | Loh | |
| 6,903,380 B2 | 6/2005 | Barnett et al. | |
| 6,930,332 B2 | 8/2005 | Hashimoto et al. | |
| 6,943,380 B2 | 9/2005 | Ota et al. | |
| 6,943,433 B2 | 9/2005 | Kamada | |
| 6,949,772 B2 | 9/2005 | Shimizu | |
| 6,960,878 B2 | 11/2005 | Sakano et al. | |
| 7,002,727 B2 * | 2/2006 | Huibers | 359/291 |
| 7,044,620 B2 | 5/2006 | Van Duyn | |
| 7,078,254 B2 | 7/2006 | Loh | |
| 7,078,728 B2 * | 7/2006 | Ishii et al. | 257/79 |
| 7,084,435 B2 | 8/2006 | Sugimoto et al. | |
| 7,102,177 B2 * | 9/2006 | Goh et al. | 257/98 |
| 7,118,262 B2 | 10/2006 | Negley | |
| 7,122,884 B2 | 10/2006 | Cabahug et al. | |
| 7,192,163 B2 | 3/2007 | Park | |
| 7,204,631 B2 | 4/2007 | Weber et al. | |
| 7,244,965 B2 | 7/2007 | Andrews et al. | |
| 7,264,378 B2 | 9/2007 | Loh | |
| 7,279,719 B2 | 10/2007 | Suehiro et al. | |
| 7,280,288 B2 | 10/2007 | Loh | |
| 7,322,732 B2 | 1/2008 | Negley | |
| 7,329,399 B2 | 2/2008 | Camaro et al. | |
| 7,456,499 B2 | 11/2008 | Loh et al. | |
| 7,659,551 B2 | 2/2010 | Loh | |
| 7,692,206 B2 | 4/2010 | Loh | |
| 7,705,465 B2 * | 4/2010 | Kimura et al. | 257/774 |
| 7,775,685 B2 | 8/2010 | Loh | |
| 7,976,186 B2 | 7/2011 | Loh | |
| 7,980,743 B2 | 7/2011 | Loh | |
| 2002/0084462 A1 | 7/2002 | Tamai et al. | |
| 2002/0113244 A1 | 8/2002 | Barnett et al. | |
| 2003/0057573 A1 | 3/2003 | Sekine et al. | |
| 2003/0067264 A1 | 4/2003 | Takekuma | |
| 2003/0168670 A1 | 9/2003 | Roberts et al. | |
| 2003/0168720 A1 | 9/2003 | Kamada | |
| 2003/0189829 A1 | 10/2003 | Shimizu et al. | |
| 2003/0189830 A1 | 10/2003 | Sugimoto et al. | |
| 2003/0193080 A1 | 10/2003 | Cabahug et al. | |
| 2003/0193083 A1 | 10/2003 | Isoda | |
| 2003/0201451 A1 | 10/2003 | Suehiro | |
| 2004/0004435 A1 | 1/2004 | Hsu | |
| 2004/0079957 A1 | 4/2004 | Andrews et al. | |
| 2004/0126913 A1 | 7/2004 | Loh | |
| 2004/0173804 A1 | 9/2004 | Yu | |
| 2004/0190304 A1 | 9/2004 | Sugimoto et al. | |
| 2005/0001433 A1 * | 1/2005 | Seelin | 290/44 |
| 2005/0093430 A1 | 5/2005 | Ibbetson et al. | |
| 2005/0152146 A1 | 7/2005 | Owen et al. | |
| 2005/0265029 A1 | 12/2005 | Epstein et al. | |
| 2006/0002678 A1 | 1/2006 | Weber et al. | |
| 2006/0083017 A1 | 4/2006 | Wang | |
| 2006/0097385 A1 * | 5/2006 | Negley | 257/722 |
| 2006/0098441 A1 * | 5/2006 | Chou | 362/294 |
| 2006/0139672 A1 | 6/2006 | Park | |
| 2006/0139945 A1 | 6/2006 | Negley et al. | |
| 2006/0215075 A1 * | 9/2006 | Huang et al. | 349/67 |
| 2006/0263545 A1 | 11/2006 | Coenjarts | |
| 2006/0292747 A1 | 12/2006 | Loh | |
| 2007/0054149 A1 | 3/2007 | Cheng | |
| 2007/0085194 A1 | 4/2007 | Mao et al. | |
| 2007/0126913 A1 | 6/2007 | Kang | |
| 2007/0200127 A1 | 8/2007 | Andrews | |
| 2008/0231170 A1 * | 9/2008 | Masato et al. | 313/501 |
| 2011/0121345 A1 | 5/2011 | Andrews et al. | |
| 2011/0186895 A1 | 8/2011 | Loh | |
| 2011/0186896 A1 | 8/2011 | Loh | |
| 2011/0186897 A1 | 8/2011 | Loh | |

FOREIGN PATENT DOCUMENTS

| | | | |
|---|---|---|---|
| CN | ZL200480030943.3 | | 3/2011 |
| DE | 19945919 | | 3/2000 |
| EP | 0965493 | | 12/1999 |
| EP | 1059678 | | 12/2000 |
| EP | 1087447 | A1 | 3/2001 |
| EP | 1179858 | | 2/2002 |
| EP | 1416219 | | 5/2004 |
| EP | 1418628 | | 5/2004 |
| EP | 1537603 | | 7/2008 |
| EP | 1953825 | | 8/2008 |
| EP | 1680816 | | 9/2009 |
| JP | H09-083018 | | 3/1997 |
| JP | 09274454 | | 10/1997 |
| JP | H10-098215 | | 4/1998 |
| JP | H10-321909 | | 12/1998 |
| JP | H11-177136 | | 7/1999 |

| JP | 2000-013962 | 1/2000 |
| JP | 2000-236116 | 8/2000 |
| JP | 2001-036148 | 2/2001 |
| JP | 2001-144333 | 5/2001 |
| JP | 2002-093206 | 3/2002 |
| JP | 2002-319711 | 10/2002 |
| JP | TW 517402 | 1/2003 |
| JP | 2003-110146 | 4/2003 |
| JP | 2003-124525 | 4/2003 |
| JP | TW 533604 | 5/2003 |
| JP | 2003-197974 | 7/2003 |
| JP | 2002103977 | 10/2003 |
| JP | 2003298117 | 10/2003 |
| JP | 2003-318448 | 11/2003 |
| JP | 2003-124528 | 5/2004 |
| KR | 10-1991-0007381 | 5/1991 |
| KR | 10-2001-0006914 | 1/2001 |
| KR | 10-1082145 | 11/2011 |
| KR | 10-1082169 | 11/2011 |
| KR | 10-1082235 | 11/2011 |
| KR | 10-1082304 | 11/2011 |
| TW | 556364 | 11/2001 |
| TW | 497758 | 8/2002 |
| TW | 518775 | 1/2003 |
| WO | WO 99/31737 | 6/1999 |
| WO | WO 2004/023522 | 3/2004 |
| WO | WO 2005/043627 | 5/2005 |

OTHER PUBLICATIONS

Non-Final Office Action for U.S. Appl. No. 11/689,868 dated Aug. 30, 2011.
International Search Report corresponding to PCT International Application No. PCT/US03/27421 dated Nov. 10, 2004.
International Search Report corresponding to PCT International Application No. PCT/US04/34768 dated Apr. 21, 2005.
Supplemental European Search Report corresponding to EP Appl. No. 03794564.9 dated Aug. 22, 2006.
Official Action corresponding to U.S. Appl. No. 11/153,724 dated Nov. 2, 2006.
Notification of International Preliminary Report on Patentability and Written Opinion corresponding to PCT International Application No. PCT/US06/023195 dated Jan. 23, 2007. (mail date).
Supplemental European Search Report corresponding to European Patent Application No. 04795871 dated Mar. 7, 2007 (also cited as International Search Report dated Feb. 27, 2007).
Official Action corresponding to U.S. Appl. No. 11/153,724 dated May 3, 2007.
Chinese Office Action for Appl. No. 03820849 with English translation dated Jul. 6, 2007.
Official Action corresponding to U.S. Appl. No. 11/153,724 dated Oct. 16, 2007.
Official Action corresponding to U.S. Appl. No. 11/694,046 dated Oct. 25, 2007.
International Search Report and Written Opinion for PCT/US06/025193 dated Oct. 29, 2007.
European Examination Report corresponding to European Patent Application No. 04795871.5 dated Nov. 12, 2007.
Official Action/Restriction Requirement corresponding to U.S. Appl. No. 11/168,018 dated Dec. 11, 2007.
Notification of International Preliminary Report on Patentability and Written Opinion for PCT International Application No. PCT/US06/023195 dated Jan. 3, 2008.
Notification of International Preliminary Report on Patentability and Written Opinion corresponding to PCT International Application No. PCT/US06/025193 dated Jan. 17, 2008.
Official Action corresponding to U.S. Appl. No. 11/168,018 dated Mar. 27, 2008.
Official Action corresponding to U.S. Appl. No. 11/694,046 dated May 7, 2008.
Official Action corresponding to U.S. Appl. No. 11/168,018 dated May 28, 2008.
EPO Notice of Patent Grant for EP 03794564.9 dated Jun. 12, 2008.
Final Office Action for U.S. Appl. No. 11/153,724 dated Jul. 1, 2008.
European Notice of Publication for EP 08157294 dated Jul. 9, 2008 (dated "received" on Jul. 14, 2008).
Chinese Office Action for CN 2004-80030943.3 (with English Translation) dated Jul. 4, 2008 but recieved Aug. 7, 2008 (incorrectly dated on some docs as "Aug. 4, 2008").
European Search Report and Written Opinion for EP 08157294.3 dated Aug. 20, 2008 ("Date of Completion—Aug. 6, 2008").
Office Action for U.S. Appl. No. 11/153,724 dated Oct. 17, 2008.
Office Action with Restriction/Election Requirement dated Oct. 20, 2008 for U.S. Appl. No. 11/689,868.
Non-final Office Action for U.S. Appl. No. 11/694,046 dated Dec. 1, 2008.
Final Office Action corresponding to U.S. Appl. No. 11/168,018 dated Dec. 10, 2008.
Chinese Office Action for CN 2004-80030943.3 with English translation dated Dec. 12, 2008.
Non-final Office Action for U.S. Appl No. 11/689,868 dated Jan. 26, 2009.
Office Action with Restriction/Election Requirement for U.S. Appl. No. 11/703,721 dated Feb. 26, 2009.
European Office Action for EP Appl. No. 08157294.3 dated Mar. 16, 2009.
Final Office Action for U.S. Appl. No. 11/153,724 dated Mar. 23, 2009.
Communication Under Rule 71(3) EPC (with enclosures) regarding intent to grant European patent for Application No. 04795871.5-222 dated Apr. 24, 2009.
Office Action (with English Summary) dated Apr. 28, 2009 regarding Japanese Patent Application No. 2004-534428.
Communication dated May 13, 2009 regarding no Opposition for European Application No. 03794564.9-2222 / Patent No. 1537603.
Official Action corresponding to Japanese Patent Application No. 2006-536764 (with English Translation) dated Jun. 9, 2009.
Official Action corresponding to U.S. Appl. No. 11/168,018 dated Jul. 7, 2009.
Official Action corresponding to U.S. Appl. No. 11/689,868 dated Jul. 17, 2009.
Notice of Allowance dated Jul. 24, 2009 regarding U.S. Appl. No. 11/694,046.
Official Action corresponding to U.S. Appl. No. 11/703,721 dated Aug. 6, 2009.
Decision to Grant from European Patent Office corresponding to European Patent Application No. 1,680,816 dated Sep. 3, 2009.
Official Action and Search Report corresponding to Taiwan Patent Applcation No. 092123988 dated Sep. 11, 2009 (with English Translation).
Official Action corresponding to Chinese Patent Application No. 2004800309433 (with English Translation) dated Sep. 25, 2009.
Official Action corresponding to U.S. Appl. No. 11/153,724 dated Nov. 9, 2009.
European Search Report corresponding to European Patent Application No. 09171045.9 dated Nov. 23, 2009.
Japanese Office Action (English Translation) corresponding to Japanese Patent Application No. 2006-536764 dated Feb. 2, 2010.
Japanese Office Action (English Translation) corresponding to Japanese Patent Application No. 2004-534428 dated Feb. 23, 2010.
Official Action corresponding to U.S. Appl. No. 11/168,018 dated Mar. 2, 2010.
Notice of Allowance corresponding to U.S. Appl. No. 11/703,721 dated Apr. 16, 2010.
Final Office Action corresponding to 11/153,724 dated Apr. 27, 2010.
Advisory Action corresponding to U.S. Appl. No. 11/168,018 dated May 13, 2010.
IPO (TW) Notice of Allowance corresponding to TW Patent Application No. 092123988 dated Jun. 8, 2010.
European Office Action corresponding to European Patent Application No. 09171045.9 dated Jun. 18, 2010.
Korean Patent Office Action corresponding to KR 10-2005-7003428 dated Jul. 29, 2010.
Non-Final Office Action for U.S. Appl. No. 12/856,320 dated Sep. 14, 2010.
Non-Final Office Action for U.S. Appl. No. 11/153,724 dated Sep. 15, 2010.

Chinese Patent Certificate dated Oct. 1, 2010 for TW Patent No. I 331380.
Japanese Notice of Issuance for JP 4602345 dated Oct. 8, 2010.
Japanese Office Action/Rejection (English Translation) corresponding to Japanese Patent Appl. No. 2004-534428 dated Oct. 19, 2010.
Chinese Notice of Patent Grant for CN Appl No. 200480030943.3 dated Oct. 29, 2010.
Notice of Allowance corresponding to U.S. Appl. No. 12/856,320 dated Mar. 3, 2011.
Japanese Notice of Allowance for JP Appl. 2004-534428 dated Mar. 29, 2011.
Notice of Allowance corresponding to U.S. Appl. No. 11/153,724 dated Apr. 14, 2011.
Taiwanese Office Action/Rejection (English Translation) corresponding to TW Patent Appl. No. 093131884 dated Apr. 15, 2011.
Korean Office Action corresponding to Korean Patent Application No. Oct. 2011-7002566 dated Apr. 19, 2011.
Korean Office Action corresponding to Korean Patent Application No. 10-2011-7002567 dated Apr. 20, 2011.
Korean Office Action corresponding to Korean Patent Application No. 10-2011-7002568 dated Apr. 20, 2011.
Korean Office Action corresponding to Korean Patent Application No. 10-2011-7002573 dated Apr. 22, 2011.
Non-Final Office Action for U.S. Appl. No. 11/168,018 dated May 9, 2011.
Korean Office Action corresponding to Korean Patent Application No. 10-2006-7007929 dated May 23, 2011.
Japanese Office Action for JP 2008-519523 dated Jun. 14, 2011.
Korean Office Action for Korean Application No. 10-2011-7002575 dated Jun. 2, 2011.
Official Action with Restriction/Election Requirement corresponding to U.S. Appl. No. 10/446,532 dated Nov. 3, 2004.
Official Action with Restriction/Election Requirement corresponding to U.S. Appl. No. 10/446,532 dated Feb. 24, 2005.
Non-Final Official Action corresponding to U.S. Appl. No. 10/446,532 dated Jul. 26, 2005.
Non-Final Official Action corresponding to U.S. Appl. No. 10/446,532 dated May 2, 2006.
Official Action with Restriction/Election Requirement corresponding to U.S. Appl. No. 10/692,351 dated Oct. 5, 2004.
Non-Final Official Action corresponding to U.S. Appl. No. 10/692,351 dated Feb. 24, 2005.
Final Official Action corresponding to U.S. Appl. No. 10/692,351 dated Nov. 16, 2005.
Official Action with Advisory Action corresponding to U.S. Appl. No. 10/692,351 dated Apr. 4, 2006.
Korean Notice of Allowance for KR Appl. No. 10-2011-7002566 dated Sep. 26, 2011.
Korean Notice of Allowance for KR Appl. No. 10-2011-7002567 dated Sep. 26, 2011.
Korean Notice of Allowance for KR Appl. No. 10-2011-7002568 dated Sep. 26, 2011.
Korean Notice of Allowance for KR Application No. 10-2011-7002573 dated Oct. 5, 2011.
Final Office Action for U.S. Appl. No. 11/168,018 dated Oct. 13, 2011.
German Office Action for Application Serial No. DE 11 2006 001 634.2 dated Nov. 15, 2011.
Notice of Allowance for U.S. Appl. No. 13/023,268 dated Jan. 6, 2012.

* cited by examiner

LED BACKLIGHTING FOR DISPLAYS

CROSS-REFERENCE TO RELATED APPLICATIONS

This application is a continuation of and claims priority to U.S. patent application Ser. No. 11/153,724, filed Jun. 14, 2005 now U.S. Pat. No. 7,980,743, the entire content of which is hereby incorporated by reference herein.

BACKGROUND

The present invention relates to the field of display devices, and more particularly to lighting of flat panel display devices such as liquid crystal display (LCD) devices.

LCD devices are widely used in flat panel displays for computer and display monitors, televisions, bill boards, road signs, and other applications. In some applications, for example as a computer display for notebook computers, LCD devices are desirable because they are much thinner and lighter than alternatives such as, for example, CRT (cathode ray tube) displays.

An LCD panel is generally (but not necessarily) configured as a thin rectangular panel having a first major surface (its "front") and a second major surface (its "back"). As a rectangular panel, it has four edges, or sides, defining the boundaries of the LCD panel. The LCD panel includes a number of sub-layers such as a liquid crystal layer and a plurality of optical filter layers. An LCD screen can consist of thousands or millions of pixels covering the screen; manipulation of these pixels, in combination of a lighting subsystem, results in the displaying effect.

As is known to those skilled in the art, an LCD does not emit light; rather, the displaying effect is produce by control of light from a side or backside lighting subsystem that provides light to the LCD panel. Thus, the quality of the displayed image depends on, in part, the quality and the wavelengths of light from the lighting subsystem (typically on the backside of the LCD panel).

A common backlit LCD device includes an LCD panel with one or more fluorescent tubes running proximal to one or more edges of the LCD panel. Light pipes guide light from the fluorescent tubes or any light source to the back surface of the LCD panel. Thus, the LCD panel is backlit allowing a viewer to more easily view, from the front surface, the information on the LCD panel. Unfortunately, such edge lighting system is inefficient with up to 50% or more of the light being lost. See, for example, U.S. Pat. No. 6,672,734 B2, U.S. Pat. No. 6,768, 525 B2, and U.S. Pat. No. 6,844,903 B2.

In an alternative design, an array of fluorescent tubes are placed near the back surface of the LCD panel allowing direct illumination of the back surface of the LCD panel thereby eliminating the need for the light pipes and increasing the efficiency of the lighting system. However, fluorescent light does not deliver all the primarily colors—Red, Green and Blue—which can then be combined to yield millions of secondary colors for the display. That is, the images displayed are not truly natural and brilliant as desired for some applications.

Consequently, there remains a need for an improved system for illuminating flat panel displays that overcomes or alleviates the shortcomings of the prior art devices. Semiconductor light emitting devices, such as Light Emitting Diode (LED) devices, also may be used for edge illumination of a planar array of LCD devices. For example, U.S. patent application Ser. No. 10/898,608, filed Jul. 23, 2004, entitled Reflective Optical Elements for Semiconductor Light Emitting Devices, to co-inventor Negley, and assigned to the assignee of the present invention, the disclosure of which is hereby incorporated herein by reference in its entirety as if set forth fully herein, describes side emission LEDs that may be used for large area LCD and/or television backlighting.

SUMMARY

The need is met by the present invention. In one embodiment of the present invention, a display system includes a display panel having a first major surface and a second major surface and a lighting system adapted to provide light proximal to the second major surface of the display panel. The lighting system includes an illuminating substrate defining an array of mounting holes and an array of light emitting diode (LED) modules, each module occupying a mounting hole of the array of mounting holes.

The illuminating substrate includes a substrate core having a first major surface and a second major surface opposite the first major surface and a light reflective layer covering at least a portion of the first major surface of the substrate core. The light reflective layer includes at least one member from a group consisting of silver, gold, aluminum, and reflective paint or coating, for example, Barium Sulfate or Titanium Dioxide paint. The light reflective layer can also incorporate optical gratings or textures of its surface to scatter light rays that are reflected from it. The illuminating substrate further includes circuit elements on the second major surface of the substrate core.

The display system may also include a diffusant layer between the display panel and the illuminating substrate. The diffusant layer receives light emitted by individual emitters of the LED modules and distributes it uniformly with minimal loss. It is optically coupled with the illuminating substrate via optical gel to minimize losses of light at the interface. Outer edges of the diffusant layer are made to a bevel angle with specular surface finishes to minimize light loss from the edges. The bevel angle can be close to critical refractive angle of the medium to promote light rays being reflected by TIR (Total Internal Refraction). Alternatively, or in combination, the edges can have reflective coating such as Barium Sulfate or Titanium Oxide paint to prevent light rays escaping through the edges.

Each of the LED modules includes one or more LED chips and conductive traces connected to the LED chips. The circuit elements are adapted to connect to the conductive traces of the LED module. The LED module may also include heat sink for improved heat dispersion.

The display panel, depending on technology and implementation, can include a plurality of sub-layers such as, for example, a first filter sub-layer, a thin film transistor sub-layer, a liquid crystal sub-layer, and a second filter sub-layer.

Other aspects and advantages of the present invention will become apparent from the following detailed description, taken in conjunction with the accompanying drawings, illustrating by way of example the principles of the invention.

DETAILED DESCRIPTION

Figure 1A:
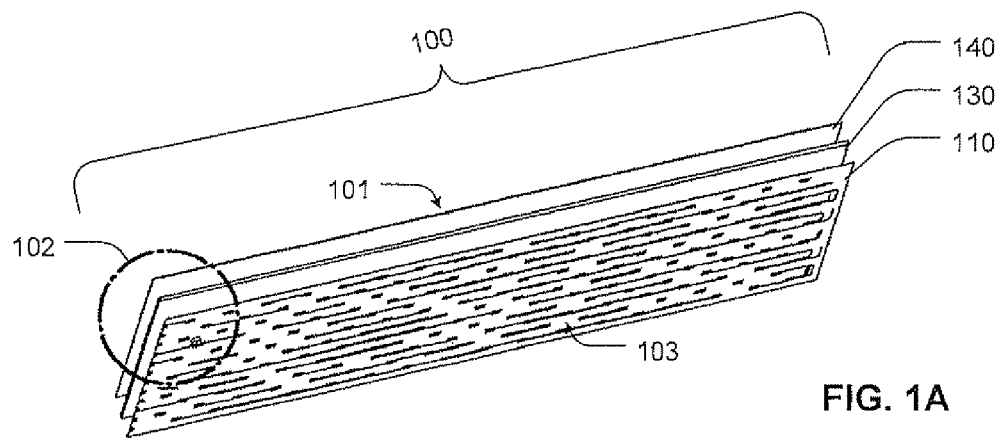
FIG. 1A is an exploded perspective view of an apparatus according to one embodiment of the present invention.

The present invention will now be described with reference to the FIGS. 1A through 4, which illustrate various embodiments of the present invention. As illustrated in the Figures, some sizes of structures or portions are exaggerated relative to other structures or portions for illustrative purposes and, thus, are provided to illustrate the general structures of the present invention. Furthermore, various aspects of the present invention are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion.

Furthermore, relative terms such as "on" or "above" are used herein to describe one structure's or portion's relationship to another structure or portion as illustrated in the Figures. It will be understood that relative terms such as "on" or "above" are intended to encompass different orientations of the device in addition to the orientation depicted in the Figures. For example, if the device in the Figures is turned over, structure or portion described as "above" other structures or portions would now be oriented "below" the other structures or portions. Likewise, if the device in the Figures is rotated along an axis, structure or portion described as "above" other structures or portions would now be oriented "next to" or "left of" the other structures or portions. Like numbers refer to like elements throughout.

As shown in the figures for the purposes of illustration, embodiments of the present invention are exemplified by a display system includes a display panel having a first major surface and a second major surface and a lighting system adapted to provide light proximal to the second major surface of the display panel. The lighting system includes an illuminating substrate defining an array of mounting holes and an array of light emitting diode (LED) modules, each module occupying a mounting hole of the array of mounting holes. The lighting system can also include a diffusant layer which is placed between the display panel and the illuminating substrate to achieve high luminous efficiency and uniform luminance.

In the present invention, LEDs (light emitting diodes) of the primary colors (Red, Green and Blue) are used to illuminate a display panel with a complete spectrum of colors by varying the electrical currents that drive the LED's. Inside the lighting system, an optical gel (rather than an air gap) couples the illuminating substrate to the diffusant layer to minimize light loss at the interface. Further, the illuminating substrate incorporates a highly reflective, grated or textured surface facing the diffusant layer to diffuse and reflect light rays to achieve high luminous efficiency and a uniform luminance. In addition, the edges of the diffusant layer are beveled at an angle and made to specular finish or coated with reflective material such that light rays that hit the edge surface are less likely to escape from the medium of the diffusant layer but is more likely to be reflected and directed towards the front side of the diffusant layer.

Details

Figure 1B:
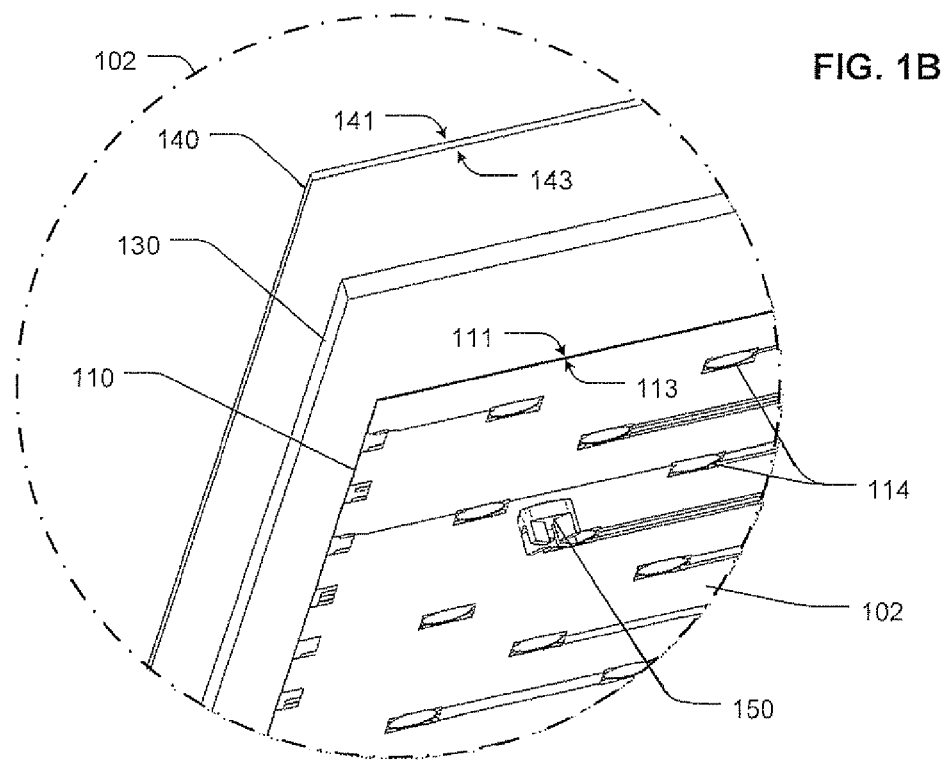
FIG. 1B is a portion of the view of FIG. 1 in greater detail.

FIG. 1A is a partially exploded perspective view of a display system 100 according to one embodiment of the present invention. FIG. 1B is a portion 102 of the display system 100 in greater detail. The display system 100 is, for example, a flat-panel computer monitor. Referring to FIGS. 1A and 1B, the display system 100 has a first major surface 101 (front) and a second major surface 103 (rear). The display system 100 is viewed from its front 101.

Figure 2A:
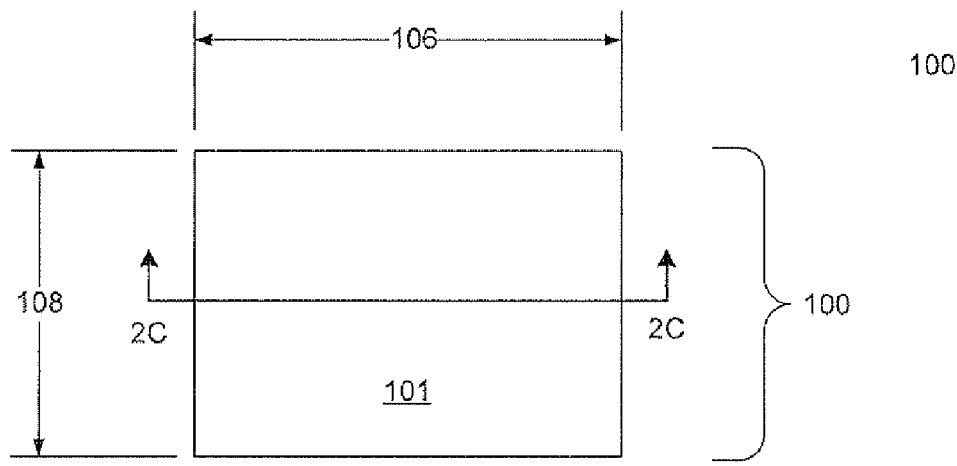
FIG. 2A is view of the apparatus of FIG. 1 from front of the apparatus.
Figure 2B:
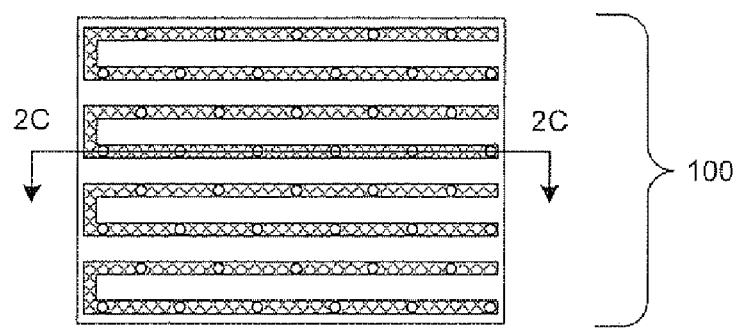
FIG. 2B is view of the apparatus of FIG. 1 from rear of the apparatus.
Figure 2C:
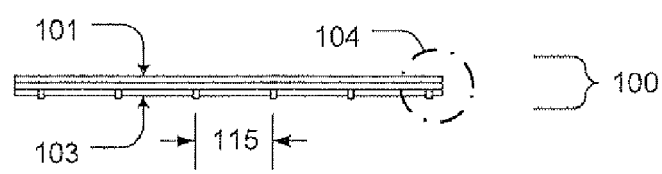
FIG. 2C is a cutaway side view of the apparatus of FIGS. 2A and 2B cut along line 2C-2C of FIGS. 2A and 2B.
Figure 2D:
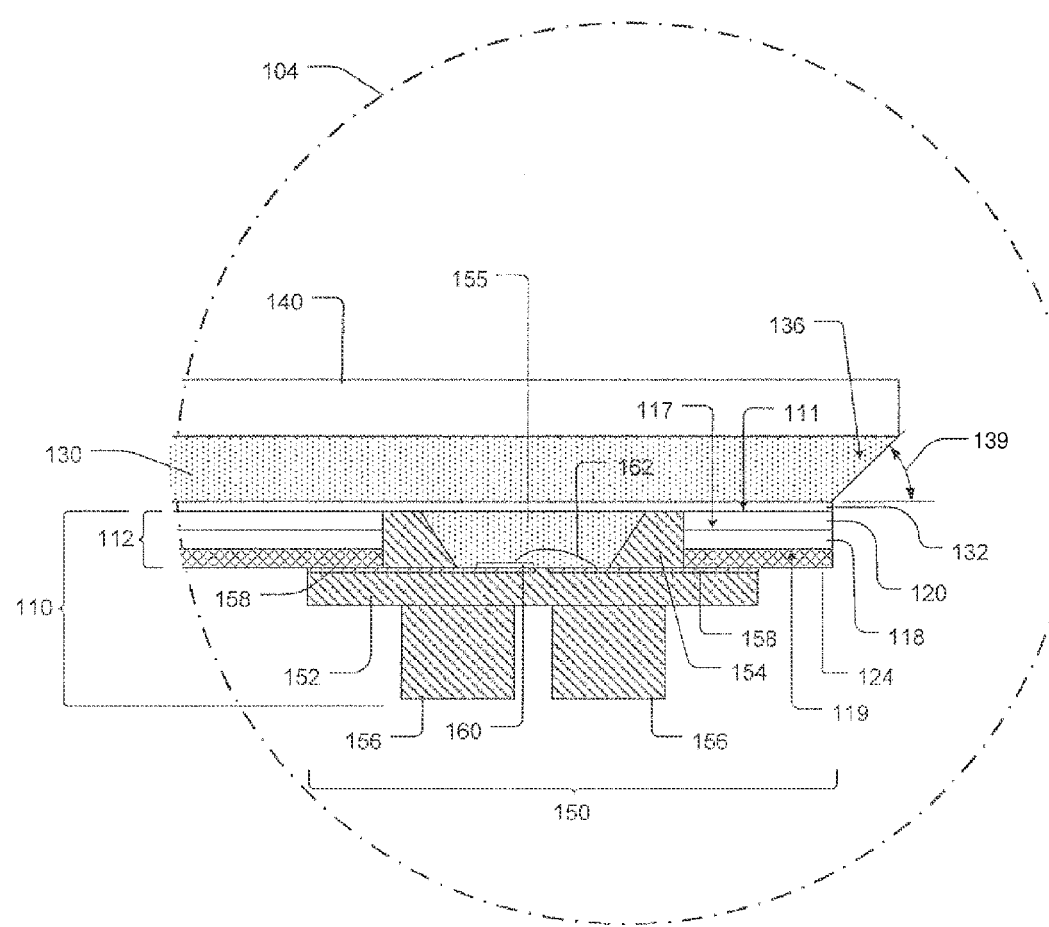
FIG. 2D is a more detailed view of a portion of the cutaway side view of FIG. 2C.

FIG. 2A is a view of the display system 100 from its front 101. FIG. 2B is a view of the display system 100 from its rear 103. FIG. 2C is a cutaway side view of the display system 100 cut along line 2C-2C of FIGS. 2A and 2B. FIG. 2D is a portion 104 of the cutaway side view of the display system 100 as illustrated in FIG. 2D in greater detail.

Referring to FIGS. 1A through 2D, the display system 100 includes a lighting system 110 adapted to provide light for a display panel 140. In the illustrated embodiment, a diffusant layer 130 which is a component of lighting system is placed between the illuminating substrate 112 and the display panel 140 to diffuse the light from the illuminating substrate 112 before the light reaches the display panel 140. The display panel 140 includes a plurality of sub-layers to polarized, filter, and otherwise operates on the diffused light whereby a desired pattern is lit and discernable from the front 101 of the display system 100.

The display system 100 can have a wide range of lateral dimensions 106, 108 depending on application and desired characteristics of the display system 100. For example, the lateral dimensions 106, 108 can be in the order of millimeters or in the order of meters or even beyond.

Lighting System

Continuing to refer to FIGS. 1A through 2D, the lighting system 110 includes the illuminating substrate 112. The illuminating substrate 112 has a first major surface 111 and a second major surface 113 and defines an array of mounting holes 114. To avoid clutter only two of eleven mounting holes 114 illustrated in FIG. 1B are pointed to with reference numeral 114. An array of light emitting diode (LED) modules 150 occupy the mounting holes 114, one LED module 150 per mounting hole 114. That is, the array of LED modules 150 is affixed to the illuminating substrate 112. Again, for clarity of discussion, only one LED module 150 is illustrated in FIG. 1B thus more clearly illustrating the mounting holes 114; however, in actual application, each mounting hole 114 is occupied by an LED module 150. In FIG. 1B, the LED module 150 is illustrated "floating" under the lighting system 110 to avoid obscuring the illustrations of the mounting holes 114.

Illuminating Substrate

The illuminating substrate 112 includes a substrate core 118 which is, for example, an insulating layer of printed circuit board (PCB). The substrate core 118 has a first major surface 117 and a second major surface 119 opposite the first major surface 117. A light reflective layer 120 covers a major portion of the first major surface 117 of the substrate core 118 forming an optically reflective surface 111 as the first major surface 111 of the illuminating substrate 112. The light reflective layer 120 can be realized by application of optically reflective material such as, for example, metal silver (Ag), gold (Au), anodized aluminum (Al), or reflective material such as Barium Sulfate, Titanium Dioxide paint. The reflective surface 111 can be polished to a specular finish. Alternatively, the reflective surface 111 can incorporate diffusing grating to promote dispersion and diffusion of light reflecting on the reflective surface 111.

The illuminating substrate 112 includes circuit elements 124 on the second major surface 119 of the substrate core 118. The circuit elements 124 can include, for example, electrically conductive traces for delivery of electrical power, ground, and control signals to the LED modules 150. The circuit elements 124 can be made of copper or other electrically conductive material.

In the illustrated embodiment, the substrate core 118, the reflective layer 120, and the circuit elements 124 have thickness in the order of a few microns to a few millimeters depending on the application. Here, the circuit elements 124 can be connection traces having a thickness in the order of several microns. Neither the reflective layer 120 nor the circuit elements 124 are allowed to cover-up the mounting holes 114 thus allowing mounting of the LED modules 150 through the illuminating substrate 112.

The illuminating substrate 112 defines the array of mounting holes 114. The size of the array (thus the number of the mounting holes 114), the shape and the dimensions of each mounting hole 114, and the spacing distance 115 between the mounting holes 114 depend on the desired application and properties of the lighting system 100. In the illustrated example embodiment, each mounting hole 114 is generally circular in shape with diameter ranging in the order of a few to several millimeters and is placed in a predetermined pattern. The shape, the size, and the spacing of the mounting hole 114 can vary widely depending on application. For example, the mounting holes 114 may have other shapes (rectangular, elliptical, or other suitable shapes), sizes ranging in the order of millimeters or less to meters or more. The spacing of the mounting holes 114 are determined by a plurality of factors such as, for example only, size of the mounting holes 114, heat dissipation requirements, and desired luminous intensity and total luminous flux. In the illustrated embodiment, the mounting holes 114 are arranged within several millimeters from each other. Much, if not the entire lighting system 110 may be populated with these mounting holes 114.

LED Modules

Figure 3:
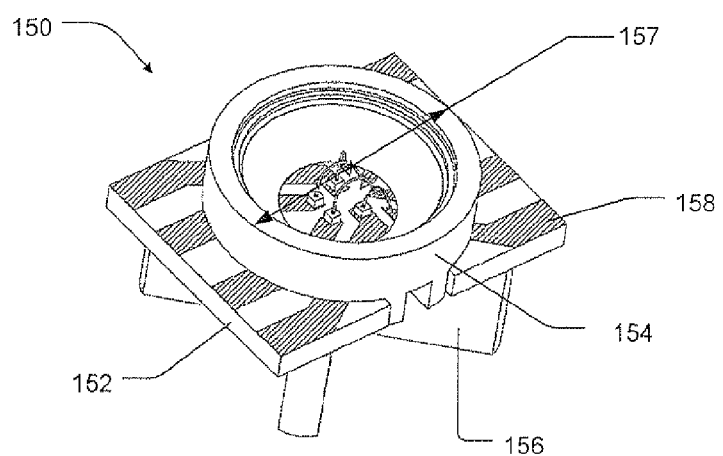
FIG. 3 is a perspective view of a LED module of FIGS. 1A through 2D.

Each mounting hole 114 is occupied by the LED module 150. FIG. 3 is a perspective view of one embodiment of the LED module 150. FIG. 2D illustrates, inter alia, a cut-away side view of the LED module 150 of FIG. 3. Referring to FIGS. 2D and 3, the LED module 150 includes a LED module body 152, a reflector cup portion 154, and a heat sink portion 156. The module body 152 provides a supporting substrate for one or a cluster of LED chips 160 which may be of different colors, for example, red, green and blue, attached to the module body 152. For convenience only one LED chip 160 is illustrated. The LED chip 160 represents one or more LED chips.

A reflector cup portion 154 of the LED module 150 surrounds and defines a cavity 155 within which the LED chip 160 is mounted to the module body 152. The reflector cup portion 154 defines an outer shape and outer dimensions that are substantially similar to the shape and the dimensions of the mounting holes 114. In the illustrated embodiment, the outer shape of reflector cup portion 154 is generally circular, and its diameter 157 is in the order of millimeters.

Electrically conductive traces 158 are provided on the module body 152 to allow for electrical connection of the LED chip 160 to the circuit elements 124 of the illuminating substrate 112 when the LED module 150 is mounted at a mounting hole 114. When the LED module 150 is mounted at a particular mounting hole 114, one or more conductive traces 158 of the LED module 150 connect with the circuit elements 124 of the illuminating substrate 112. The conductive traces 158 are connected to the bottom side LED chip 160, top side of the LED chip 160 via bond wire 162, or both. The LED chip 160 can be, for example only, from chemicals GaN for blue and green lights and AlGaAsP for Red.

After the placement of the LED chip 160, the bond wire 162, or both, the cavity 155 can be filled with encapsulant material such as, for example, soft thermo-set plastics such as, for example, silicone, epoxy, or a combination of these. The encapsulant material can include additional material such as, for example, wavelength shifting material such as phosphors to absorb light having a first wavelength and reemit the light at a second wavelength. Further, the encapsulant material can include material to diffuse the light from the LED chip 160 for example, glass, titanium dioxide, barium sulfate, calcium carbonate, and other suitable material.

The LED modules 150 are mounted in the mounting holes 114 to allow light to launch toward the diffusant layer 130, and eventually to the display panel 140. The LED modules 150 can be mounted in the mounting holes 114 using solders, or any electrically conductive adhesive, such as, for example, Ag-epoxy.

Heat Sink

When the LED chip 160 is activated, light and heat are generated by the LED chip 160. The heat spreads throughout the LED module 150. Much of the heat is dissipated by the heat sink 156 which can be an integral portion of, or attached to the module body 152 to increase the thermal dissipation capacity of the LED module 150 to an extend that no additional heatsink is needed to dissipate heat generated by LEDs.

Diffusant Layer

Referring again to FIGS. 1A through 2D, in the illustrated embodiment, the diffusant layer 130, a component of the display system 100, is placed between the illuminating substrate 112 and the display panel 140. The diffusant layer 130, though, is not necessary in all embodiments. The diffusant layer 130 can be made of transparent material such as glass or transparent plastics such as polycarbonate or Polymethylmethacrylate (PMMA) that is filled with small particles of light reflective material, for example only, Barium Sulfate, Titanium Dioxide, or other suitable material. When an LED module 150 emits light, its light rays cover only a smaller area of the illuminating substrate. After passing through the diffusant layer, the light rays will cover a much larger area, hence delivering a uniform luminance on the front face of the diffusant layer for illuminating a display panel. In additional, phosphors may be added in the diffusant layer to absorb certain wavelengths of light and re-emit other wavelengths.

Figure 2E:
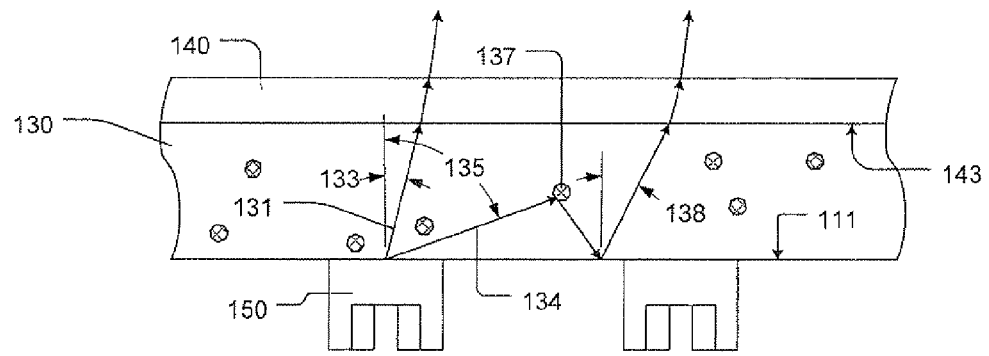
FIG. 2E is a simplified diagram of another portion of the display system 100 of FIGS. 2A through 2D.

FIG. 2E is a simplified diagram of another portion of the display system 100 of FIGS. 2A through 2D. Referring to FIG. 2E, the LED module 150 emits light in a wide range of angles relative to the normal axis of second major surface (back) 143 of the display panel 140. A first portion of the emitted light illustrated by ray 131 is emitted at a first angle 133 relative to normal (perpendicular) to the back 143 of the display panel 140 such that the light 131 is transmitted directly through the diffusant layer 130 into and beyond the display panel 140. This is when the first angle 133 is less than the TIR (Total Internal Refraction) angle presented by the back surface 143 of the display panel 140.

A second portion of the emitted light illustrated by ray 134 is emitted at a second angle 135 relative to the back 143 of the display panel 140. The second angle 135 can be, in the present example, greater than the TIR (Total Internal Refraction) angle presented by the back surface 143 of the display panel 140. In the illustrated embodiment, the second portion 134 of the emitted light reflects off of a diffusant 137, then off the optically reflective surface 111 toward the back surface 143 of the display panel 140 at a third angle 138 less than the TIR angle. If, for example, the diffusant 137 were not present, the light ray 134 would have an angle of incident on the back surface 143 at an angle greater than the critical angle, hence totally reflected from it. Subsequently, ray 134 may be trapped between the two surfaces and its luminous intensity be reduced by a small percentage at each reflection and the weaker ray 134 may eventually exit from the medium. As illustrated, the diffusant 137 reduces loss of light. Further, the diffusant 137 allows light from an LED module to be scattered and spread out thus covering a larger area. This has the effect of mixing light from multiple LED modules. Accordingly, more uniform light is provided to the LED panel 140.

Consequently, light from a plurality of LED modules 150 are mixed in the diffusant layer 130 as it interacts with the light scattering particles and layer interfaces. Light reflected back toward the illuminating substrate 112 is reflected back toward the display panel 140 by the reflective surface 111 of the illuminating substrate 112, hence conserving the photons emitted by the light sources.

Referring to FIGS. 2A through 2E, the diffusant layer 130 is placed in direct contact with the front face of illuminating substrate 112. Alternatively, as illustrated in the Figures, the diffusant layer 130 can be optically coupled with the lighting system 110 by optical gel 132 which can be Nye's soft silicone gel. The optical gel 132 may be filled with phosphors or a diffusants. The optical gel 132 can have a refractive index that matches the refractive index of the diffusion layer to minimize interface loss.

To minimize loss of light from the side edges of the diffusant layer 130, the edges of the diffusant layer 130 may be specular finished and beveled at an angle 139 such that light rays that hit at the edges are reflected at TIR (Total Internal Reflection) angle. Alternatively, the surface 136 of the edges of the diffusant layer 130 can include a reflective coating 136 realized by application of optically reflective material such as, for example, silver (Ag), gold (Au), aluminum (Al), or any other reflective material such as Barium Sulfate, Titanium Dioxide.

Display Panel

Referring again to FIGS. 1A through 2D, in the illustrated embodiment, the display panel 140 has a first major surface 141 (its "front") and a second major surface 143 (its "back"). The display panel 140 is a controllable and partially translucent display panel known in the art. For example, the display panel 140 can be a TFT (Thin Film Transistor) LCD (Liquid Crystal Display) type panel designed to work with backlight provided by the lighting system 110. The display panel 140, as a TFT LCD panel, includes a number of sub-layers. The display panel 140 includes a first polarizing filter sub-layer, a thin film transistor sub-layer, a liquid crystal sub-layer, a color filter sub-layer, and a second polarizing filter sub-layer. Design and operations of these sub-layers and the TFT LCD panel 140 is known to those skilled in the art.

The lighting system 110 provides light proximal to the second major surface 143 of the display panel 140. The diffused light is provided to the display panel 140. The sub-layers of the display panel 140 are connected to, powered by, and controlled with various circuits (not illustrated) outside the display system 100 to operate on the light entering the display panel 140 selectively allowing varying portions of the diffused light through the display panel 140. The result is that a desirable, viewable pattern or other information appears on the surface 101 of the display system 100.

The display system 100 is applicable in a wide range of application such as, for example only, displays of instruments and watches, computer monitors, television, bill boards, road signs, and commercial advertisement displays.

CONCLUSION

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used to practice the present invention. The invention is limited by the claims that follow.

The invention claimed is:

1. An illuminating substrate comprising:
   a first major surface;
   a second major surface opposite the first major surface;
   a substrate core having a first major core surface and a second major core surface opposite the first major core surface, the first major core surface being on a same side of the substrate core as the first major surface of the illuminating substrate and the second major core surface being on a same side of the substrate core as the second major surface of the illuminating substrate; and
   circuit elements disposed on the second major core surface, the circuit elements comprising at least a portion of the second major surface of the illuminating substrate; and
   the substrate core and the circuit elements together defining at least one mounting hole through the illuminating substrate.

2. The illuminating substrate of claim 1 further comprising a light reflective layer covering at least a portion of the first major core surface of the substrate core.

3. The illuminating substrate of claim 2 wherein the light reflective layer comprises at least one member from a group consisting of silver, gold, aluminum, reflective paint, barium sulfate, and titanium dioxide.

4. The illuminating substrate of claim 2 wherein the light reflective layer comprise diffusion grating.

5. The illuminating substrate of claim 2 wherein the reflective layer comprises at least a portion of the first major surface of the illuminating substrate.

6. The illuminating substrate of claim 1 wherein the at least one mounting hole comprises an array of mounting holes.

7. The illuminating substrate of claim 6 further comprising an array of light emitting diode (LED) modules, each module comprising an LED chip, wherein each of the modules is substantially adjacent to the second major surface and forms an electrical connection with the circuit elements of the second major surface and at least a portion of each of the LED modules occupying a corresponding mounting hole of the array of mounting holes.

8. The illuminating substrate of claim 7 wherein each of the LED modules further comprises a reflector cup defining a cavity with the LED chip of the respective LED module positioned within the cavity.

9. The illuminating substrate of claim 8 wherein each of the reflector cups defines an outer shape that fittingly affixes within the corresponding mounting hole in the illuminating substrate.

10. The illuminating substrate of claim 7 wherein the LED module comprises at least one LED chip and conductive traces connected to the LED chip.

11. The illuminating substrate of claim 10 wherein the circuit elements are adapted to connect to the conductive traces of the LED module.

12. The illuminating substrate of claim 7 wherein each LED module comprises a cluster of LED chips, the LED chips emitting light at different wavelengths or colors.

13. The illuminating substrate of claim 1 further comprising a diffusant layer disposed over at least a portion of the first surface, the diffusant layer optically coupled to the first surface via an optical gel.

14. The illuminating substrate of claim 13 wherein the optical gel comprises phosphors.

15. The illuminating substrate of claim 13 wherein the diffusant layer comprises edges having a reflective coating.

16. The illuminating substrate of claim 13, wherein the optical gel comprises a material having a refractive index equal to the refractive index of the diffusant layer.

17. The illuminating substrate of claim 1 wherein the circuit elements comprise conductive traces.

18. The illuminating substrate of claim 1 wherein the first major core surface of the substrate core is adjacent at least a portion of the first major surface of the illuminating substrate.

19. A lighting system comprising:
an illuminating substrate comprising a first major surface and a second major surface opposite the first major surface, the illuminating substrate comprising:
a substrate core having a first major core surface and a second major core surface opposite the first major core surface, the first major core surface being on a same side of the substrate core as the first major surface of the illuminating substrate and the second major core surface being on a same side of the substrate core as the second major surface of the illuminating substrate;
circuit elements disposed on the second major core surface, the circuit elements comprising at least a portion of the second major surface of the illuminating substrate; and
the substrate core and the circuit elements together defining a mounting hole through the illuminating substrate; and
a light emitting diode (LED) module, the module comprising an LED chip, wherein the module is substantially adjacent to the second major surface of the illuminating substrate and forms an electrical connection with the circuit elements of the second major surface of the illuminating substrate and at least a portion of the LED module occupies the mounting hole.

20. The lighting system of claim 19 further comprising a light reflective layer covering at least a portion of the first major core surface of the substrate core.

21. The lighting system of claim 20 wherein the light reflective layer comprises at least one member from a group consisting of silver, gold, aluminum, reflective paint, barium sulfate, and titanium dioxide.

22. The lighting system of claim 20 wherein the light reflective layer comprises diffusion grating.

23. The lighting system of claim 20 wherein the reflective layer comprises at least a portion of the first major surface of the illuminating substrate.

24. The lighting system of claim 19 further comprising a heat sink.

25. The lighting system of claim 19 wherein the LED module comprises a cluster of LED chips, the LED chips emitting light at two or more different wavelengths or colors.

26. The lighting system of claim 19 wherein the LED module comprises one or more electrically conductive traces and is substantially adjacent to the second major surface of the illuminating substrate such that the one or more electrically conductive traces electrically connect with the circuit elements of the second major surface of the illuminating substrate.

27. The lighting system of claim 19 wherein the LED module further comprises a reflector cup defining a cavity with the LED chip of the LED module positioned within the cavity.

28. The lighting system of claim 27 wherein the reflector cup of the LED module defines an outer shape that fittingly affixes within the corresponding mounting hole in the illuminating substrate.

29. The lighting system of claim 19 wherein the first major core surface of the substrate core is adjacent at least a portion of the first major surface of the illuminating substrate.

* * * * *